US012567716B2

(12) United States Patent
Zibik et al.

(10) Patent No.: US 12,567,716 B2
(45) Date of Patent: Mar. 3, 2026

(54) ASYMMETRIC CHIRPED FIBER BRAGG GRATING FOR DIODE LASER OF FIBER AMPLIFIER

(71) Applicant: II-VI Delaware, Inc, Wilmington, DE (US)

(72) Inventors: Evgeny Zibik, Zurich (CH); Jeffrey Steven Greatrex, Torquay (GB)

(73) Assignee: II-VI DELAWARE, INC., Wilmington, DE (US)

( * ) Notice: Subject to any disclaimer, the term of this patent is extended or adjusted under 35 U.S.C. 154(b) by 1065 days.

(21) Appl. No.: 17/453,418

(22) Filed: Nov. 3, 2021

(65) Prior Publication Data

US 2023/0134631 A1     May 4, 2023

(51) Int. Cl.
*H01S 3/094*     (2006.01)
*H01S 3/067*     (2006.01)
*H01S 5/14*      (2006.01)

(52) U.S. Cl.
CPC .... *H01S 3/094053* (2013.01); *H01S 3/06754* (2013.01); *H01S 3/094003* (2013.01); *H01S 5/147* (2013.01)

(58) Field of Classification Search
CPC .... H01S 3/0675; H01S 3/06754; H01S 5/147; H01S 3/094053
See application file for complete search history.

(56) References Cited

U.S. PATENT DOCUMENTS

| | | | |
|---|---|---|---|
| 2005/0063430 A1* | 3/2005 | Doucet | H01S 3/0675 |
| | | | 372/102 |
| 2007/0091948 A1* | 4/2007 | Teodoro | H01S 3/06754 |
| | | | 372/39 |
| 2014/0071455 A1* | 3/2014 | Dimashkie | H01S 5/02438 |
| | | | 385/11 |

OTHER PUBLICATIONS

Feng et al., "Study of chirped fiber Bragg gratings apodized with different apodization length ratios," Proceedings of SPIE vol. 7158, 715819 (2009). (Year: 2009).*
Panchal et al., "Facet coating of diode laser for high-power and high-reliable operation", Proc. SPIE 4829, 19th Congress of the International Commission for Optics: Optics for the Quality of Life, (Nov. 19, 2003). (Year: 2003).*

* cited by examiner

*Primary Examiner* — Yuqing Xiao
*Assistant Examiner* — Zhengqing Qi
(74) *Attorney, Agent, or Firm* — Blank Rome LLP

(57)     ABSTRACT
A fiber amplifier to amplify seed light has a laser diode, an optical fiber segment, and a doped fiber. The laser diode generates pump light at a pump wavelength from an end facet, and optical fiber segment in optical communication with the pump light has a fiber Bragg grating (FBG) configured to lock the pump light from the end facets to the pump wavelength. The pump light from the laser diode interact with an active dopant of the doped fiber and can thereby amplifies the seed light. To provide less coherent light and improve stability of the laser diode over operation conditions, variations in refractive index in the FBG have a chirped period changing linearly along a length of the FBG. The chirped period shifts the reflectivity asymmetrically from a central wavelength region of the FBG, such as blue-shifting the reflectivity for a short wavelength.

20 Claims, 8 Drawing Sheets

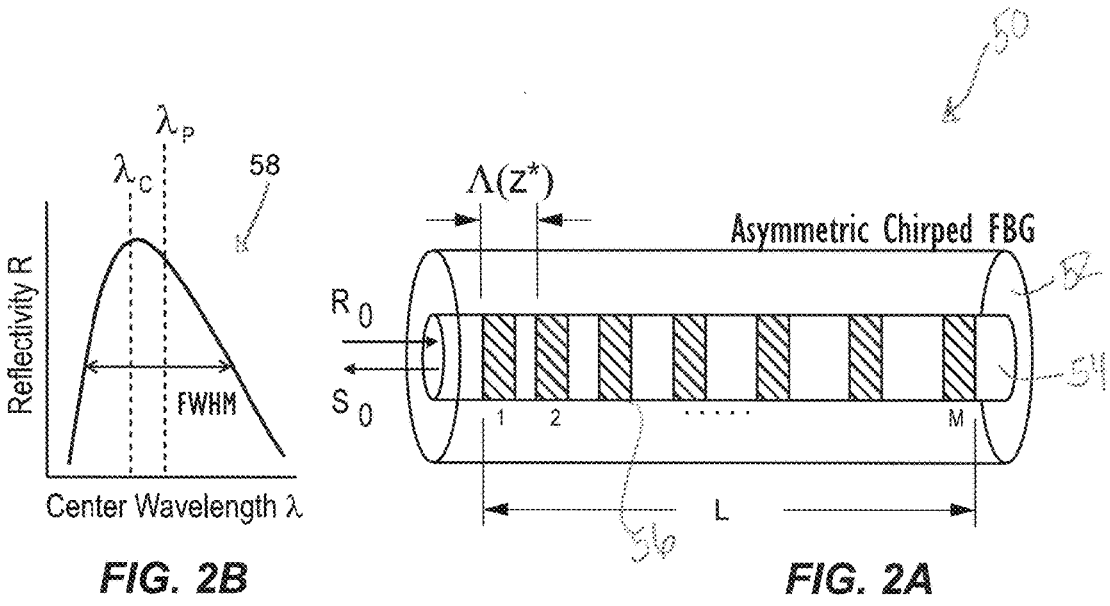
FIG. 2B
FIG. 2A
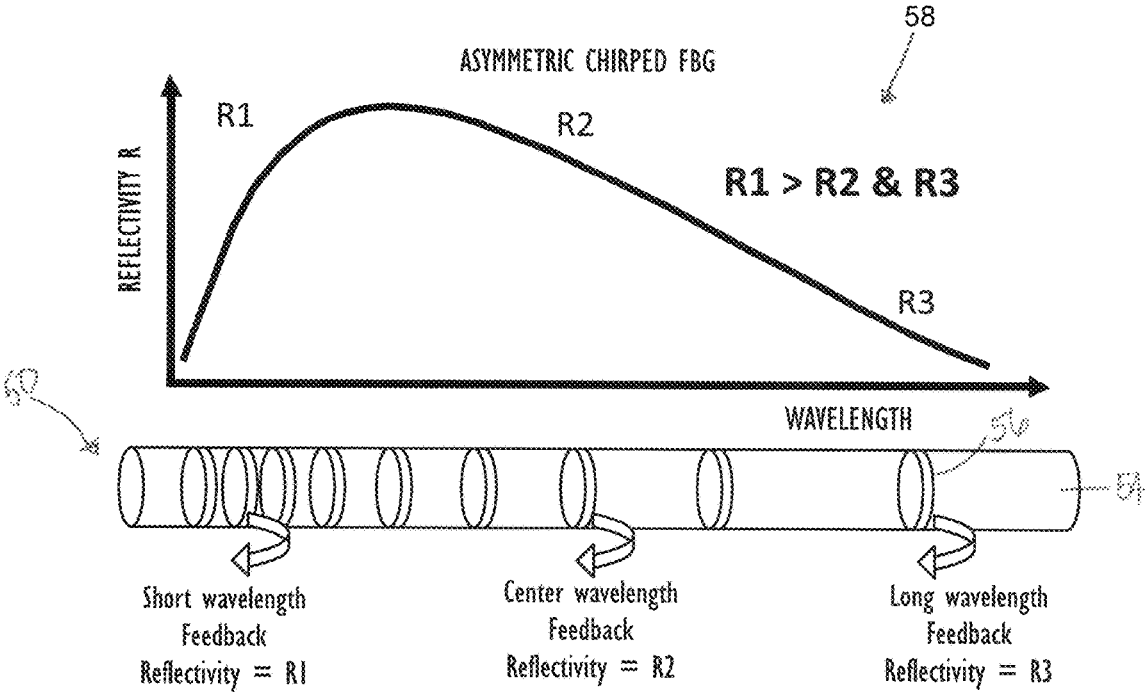
FIG. 2C

Standard FBG Profile

Asymmetric FBG Profile

ASYMMETRIC CHIRPED FIBER BRAGG GRATING FOR DIODE LASER OF FIBER AMPLIFIER

BACKGROUND OF THE DISCLOSURE

Laser diodes are used for optical fiber amplifiers, and fiber Bragg gratings (FBG's) are used with the laser diodes to lock them to a pump wavelength. Some common types of fiber Bragg gratings include a uniform fiber Bragg grating and a chirped fiber Bragg grating. The uniform fiber Bragg grating has grating elements uniformly spaced along a length of a fiber member. By contrast, the chirped fiber Bragg grating has grating elements that increase in spacing along a length of a fiber member.

Both of these types of fiber Bragg gratings have their own benefits and uses. As one example, a fiber Bragg grating, such as a chirped fiber Bragg grating, can offer wider bandwidths and can increase the number of laser modes captured within the envelope of the fiber Bragg grating when used with a laser diode. The spectral bandwidth of the resulting laser output creates more incoherent light that can improve output power variation for the optical fiber amplifier. In essence, the wider bandwidth from the chirped fiber Bragg grating allows for more modes to be captured within the envelope of the fiber Bragg grating, thus increasing the power sharing across an increased number of modes.

Although existing fiber Bragg gratings used with laser diodes in optical fiber amplifiers may be effective, the subject matter of the present disclosure is directed to improving implementations, such as optical fiber amplifiers having laser diodes.

SUMMARY OF THE DISCLOSURE

An optical device disclosed herein is used with a laser diode. The laser diode has an end facet and is configured to output light at a selected wavelength. The optical device comprises an optical fiber segment configured to optically interact with the output light. The optical fiber has a fiber Bragg grating, which has a plurality of refractive index variations. The refractive index variations have a chirped period changing spatially along a length of the fiber Bragg grating. The refractive index variations in the chirped period have a first reflectivity for a short wavelength region of the fiber Bragg grating. The first reflectivity is shifted asymmetrically from a central wavelength region of the fiber Bragg grating, is greater than a second reflectivity of the central wavelength region, and is greater than a third reflectivity of the other of the long wavelength region.

A fiber amplifier disclosed herein is used to amplify seed light having a seed wavelength. The fiber amplifier comprises a laser diode, an optical fiber segment, and a doped fiber. The laser diode is configured to generate pump light at a pump wavelength. The laser diode has front and back end facets. The front end facet has a front reflectivity, and the back end facet has a back reflectivity.

The optical fiber segment is in optical communication with the pump light from the second end facet. The optical fiber segment has a fiber Bragg grating configured to lock the pump light to the pump wavelength. The fiber Bragg grating has a length and has a plurality of refractive index variations, which have a chirped period changing spatially along the length of the fiber Bragg grating. The refractive index variations in the chirped period have a first reflectivity for a short wavelength region of the fiber Bragg grating. The first reflectivity is shifted asymmetrically from a central wavelength region of the fiber Bragg grating, is greater than a second reflectivity for the central wavelength region, and is greater than a third reflectivity for a long wavelength region. The doped fiber is doped with an active dopant. The fiber is in optical communication with the seed light and is in optical communication with at least a portion of the pump light from the laser diode. The pump wavelength of the pump light is configured to interact with the active dopant of the fiber and thereby amplify the seed light.

A method is disclosed herein to amplify seed light having a seed wavelength. The method comprises: generating pump light with a laser diode, the pump light having a pump wavelength different from the seed wavelength, the laser diode having a front facet with a front reflectivity; coupling the pump light from the front facet of the laser diode with an optical fiber segment having a fiber Bragg grating, the fiber Bragg grating having a length and having a plurality of refractive index variations, the refractive index variations having a chirped period changing spatially along the length of the fiber Bragg grating; locking the pump light of the laser diode to the pump wavelength by reflecting at least a portion of the pump light back to the front facet using the fiber Bragg grating, the refractive index variations in the chirped period having a first reflectivity for a short wavelength region of the fiber Bragg grating, the first reflectivity being shifted asymmetrically from a central wavelength region of the fiber Bragg grating, being greater than a second reflectivity for the central wavelength region, and being greater than a third reflectivity for a long wavelength region; transmitting the seed light and at least a portion of the pump light to a doped fiber; and amplifying the seed light by interacting the pump light with the doped fiber.

The foregoing summary is not intended to summarize each potential embodiment or every aspect of the present disclosure.

BRIEF DESCRIPTION OF THE DRAWINGS

FIG. 2A illustrates an asymmetric chirped fiber Bragg grating according to the present disclosure.

FIG. 2B graphs wavelength versus reflected power for an envelope of the disclosed asymmetric chirped fiber Bragg grating.

FIG. 2C graphs wavelength versus reflectivity for the disclosed asymmetric chirped fiber Bragg grating in more detail.

DETAILED DESCRIPTION OF THE DISCLOSURE

Figure 1A:
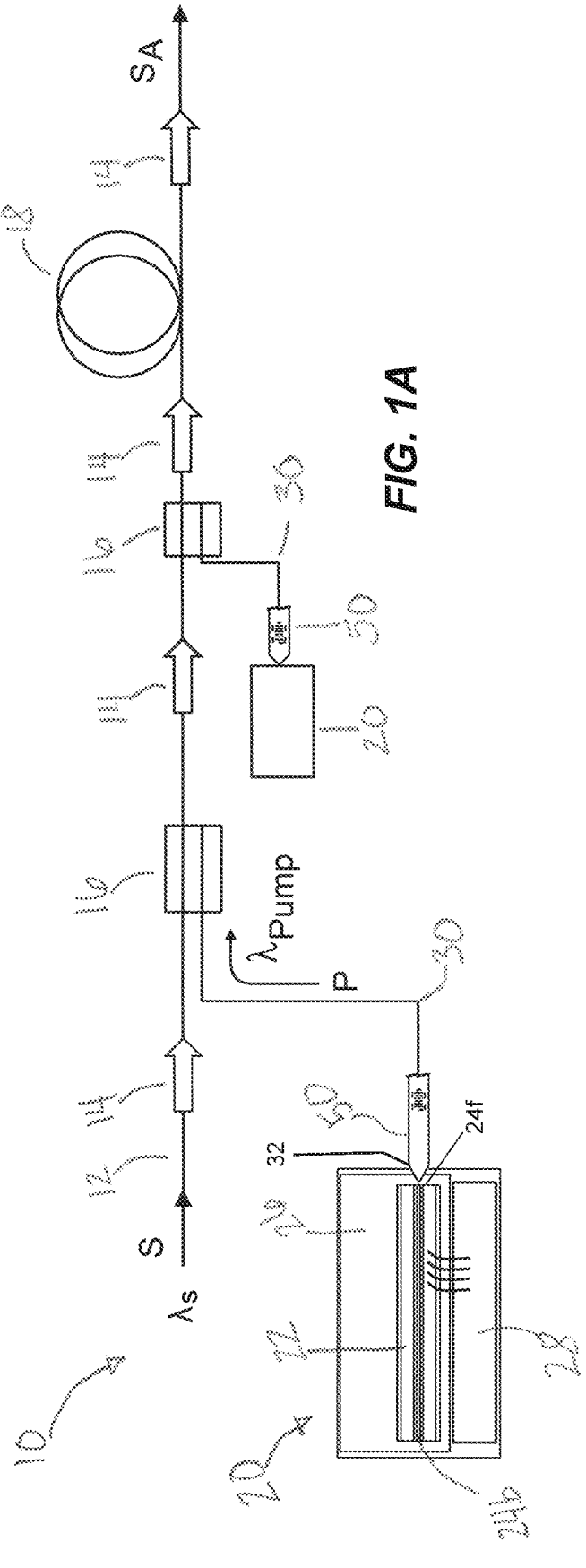
FIG. 1A illustrates an optical fiber amplifier according to the present disclosure.

FIG. 1A illustrates an optical amplifier 10 having a pump laser 20 outputting pump light P for a doped fiber 18. Source or seed light S passing along an optical path 12, which can include optical fibers, passes through an isolator 14 to a combiner 16. The isolator 14 may be configured to prevent or at least reduce back reflection from the combiner 16. For its part, the combiner 16 combines the seed light S with the pump light P received from the pump laser 20 via a pump path, which includes an optical fiber segment 30 and an asymmetric chirped fiber Bragg grating (FBG) 50 according to the present disclosure. In general, the combiner 16 can be a dichroic pump coupler, fused-fiber coupler, or other coupler configured to combine the pump light P with the seed light S.

The pump laser 20 is a laser diode having a waveguide 22, an active layer, cladding layers, a cathode 26, an anode 28, a substrate, and other necessary components. Other mounting configurations are possible. The waveguide 22 has a laser cavity formed by front and back mirrors on its end facets 24b, 24f. The front and back mirrors on the end facets 24b, 24f have power reflectivities of Rf and Rb, respectively, for which Rf<Rb.

During operation of the optical fiber amplifier 10, the seed light S has a seed wavelength $\lambda_S$, and the pump light P received at the combiner 16 has a pump wavelength $\lambda_{Pump}$. The value of the pump wavelength $\lambda_{Pump}$ is selected to provide optical amplification to the seed light S operating at the seed wavelength As in the presence of a specific rare-earth dopant within the doped fiber 18. The dopant may be erbium, ytterbium, or other dopant. When the dopant is erbium, the wavelength $\lambda_{Pump}$ of the pump light P emitted by the laser 20 may be about 980 nanometers (nm) (e.g., 970 nm to 990 nm), such as a wavelength of 972 nm, 974 nm, 976 nm, or 978 nm. In some embodiments, the pump light P at the wavelengths $\lambda_{Pump}$ of about 980 nanometers may be configured to provide amplification in the doped fiber 18 to the seed lights S when the seed wavelengths $\lambda_S$ of the seed light S is about 1550 nm, such as wavelengths in the C band (~1525 nm to 1570 nm), or about 1590 nm, such as wavelengths in the L band (~1570 nm to 1625 nm).

The combiner 16 outputs the seed light S combined with the pump light P to the doped fiber 18. The pump light P at the pump wavelength $\lambda_{Pump}$ energizes ions in the doped fiber 18, and the seed light S at the seed wavelength $\lambda_S$ interacts with the energized ions. In particular, photons of the seed light S at the seed wavelength $\lambda_S$ stimulates emission of photons from the energized ions at the seed wavelength $\lambda_S$ to generate the amplified light $S_A$. The amplified light $S_A$ can then pass through an isolator 14 to an output. The system 10 may include additional pump lasers 20, combiners 16, and the like, such as shown here.

According to the present disclosure, the laser diode 20 uses the asymmetric chirped fiber Bragg grating 50 of the optical fiber segment 30 for wavelength feedback. In particular, the pump light emitted through the front facet 24f is coupled into the optical fiber segment 30. To increase the coupling efficiency, a lens or lens structure 32 having an antireflection coating can be fabricated on the fiber tip of the optical fiber segment 30. For example, the lens or lens structure 32 can include a taper or cone fabricated on the fiber tip, but other structures can be used, such as cylinder, angled cleave, flat cleave, etc.

The pump light P propagates along the optical fiber segment 30 and is reflected by the fiber Bragg grating 50, which has a grating reflectivity profile or envelope Rg. The fiber Bragg grating 50 is positioned at a given distance from the laser's end facet 24f, and the front facet's mirror and the fiber Bragg grating 50 produce an external resonator cavity for the laser light. As will be appreciated, particular values for the reflectivities Rf, Rb, and Rg can depend on the implementation. In a general case, the values for reflectivities are Rb>Rg>Rf. The reflectivity bandwidth for Rf and Rb is much wider as compared to the reflectivity bandwidth of the Rg. Two main optical cavities are formed by the disclosure configuration. The first optical cavity is between Rb and Rf, while the second optical cavity is between Rb and Rg. For the purposes of the present teachings, the optical cavity between Rf and Rg is not under consideration. Instead, when the contribution of the external cavity (optical fiber segment 30 and fiber Bragg grating 50) dominates the reflectivity Rf, the laser diode 20 can be locked to wavelength(s) defined by the fiber Bragg grating 50.

In general, the disclosed fiber Bragg grating 50 defines the gain of the laser diode 20 at $\lambda_B=\lambda_{Pump}$ over a wide range of operating conditions. To do this, the fiber Bragg grating 50 reflects a portion of the pump light P back to the laser diode 20 to lock the laser diode 20 to a narrow wavelength interval configured to overlap with an absorption band for the doped fiber 18.

More particularly, the disclosed fiber Bragg grating 50 may be configured to reflect back a predetermined wavelength or multiple predetermined wavelengths that may "lock" the laser diode 20 to the predetermined wavelength(s) such that the laser diode 20 exhibits stable lasing at the predetermined wavelength(s). In other words, the fiber Bragg grating 50 is configured to reflect back one or more wavelengths, and the reflected light coupled through the end facet 24f into the laser diode 20 interacts generally with the laser diode 20 such that the laser diode 20 is locked to predetermined wavelength(s).

Figures 9A, 9B:
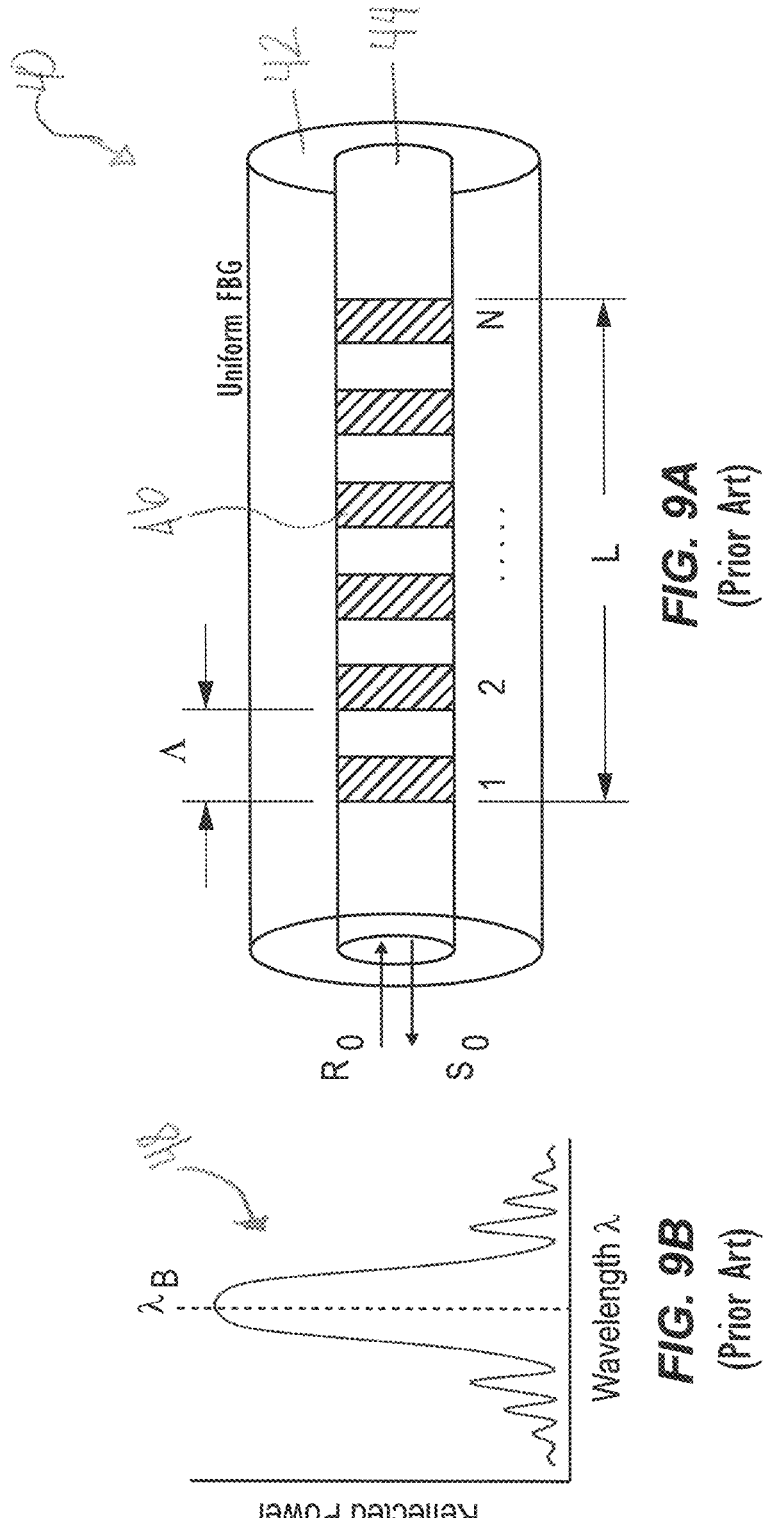
FIG. 9A illustrates a uniform fiber Bragg grating known in the art.
FIG. 9B graphs wavelength versus reflected power for an envelope of the uniform fiber Bragg grating.
Figures 10A, 10B, 10C:
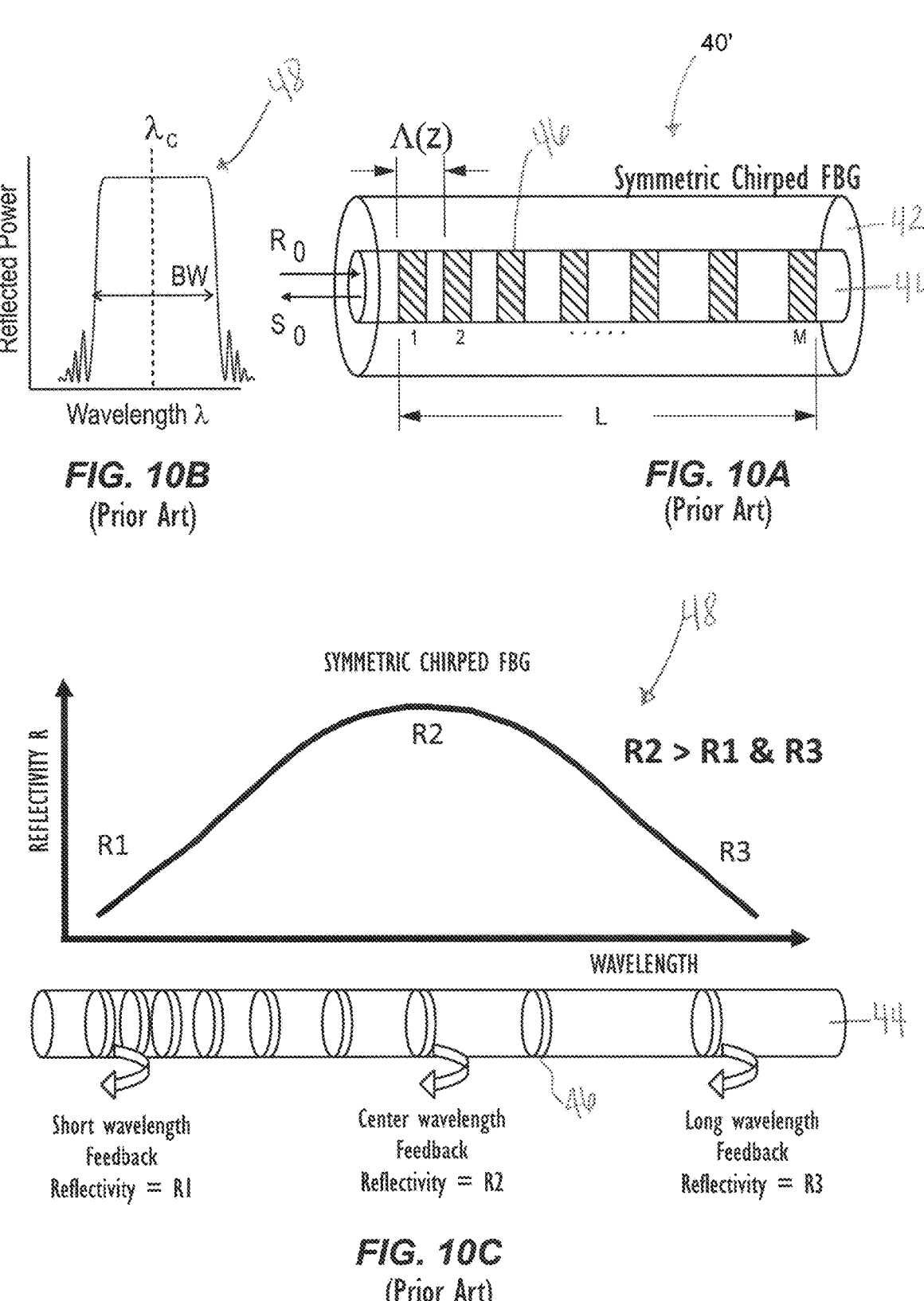
FIG. 10A illustrates a standard chirped fiber Bragg grating known in the art.
FIG. 10B graphs wavelength versus reflected power for an envelope of the standard chirped fiber Bragg grating.
FIG. 10C graphs wavelength versus reflectivity for the standard chirped fiber Bragg grating in more detail.

According to the present disclosure, the disclosed fiber Bragg grating 50 for the laser diode 20 includes an asymmetric chirped fiber Bragg grating, which is discussed in more detail below. The asymmetric chirped fiber Bragg grating 50 is different from a uniform fiber Bragg grating (40: FIG. 9A) and a standard chirped fiber Bragg grating (40': FIG. 10A) found in the existing art. Before discussing the asymmetric chirped fiber Bragg grating 50 of the present disclosure, the uniform fiber Bragg grating (40: FIG. 9A) and the standard chirped fiber Bragg grating (40': FIG. 10A) found in the existing art are initially discussed.

FIG. 9A illustrates a uniform fiber Bragg gating 40 as known in the art, and FIG. 9B graphs wavelength versus reflected power for an envelope 48 of the uniform fiber Bragg gating 40. In the uniform fiber Bragg grating 40, a number (N) of grating elements 46 are formed at a uniform period (A) along a length (L) of a core 44 of a fiber having a cladding 42. The grating elements 46 are variations in the refractive index of the fiber core 44.

For the uniform fiber Bragg grating 40 (assuming no strain or temperature variation), the Bragg wavelength is equal to:

$$\lambda_B = 2\Lambda n_{eff}$$

where $\Lambda$ is the period of the refractive index modulation, and $n_{eff}$ is the effective refractive index of the fiber core 44. As shown in FIG. 9B, the envelope 48 of the reflected power for the uniform fiber Bragg grating 40 is centered at the Bragg wavelength $\lambda_B$.

In contrast to the uniform fiber Bragg grating 40, a standard chirped fiber Bragg grating 40' as shown in FIG. 10A has grating elements 46 arranged in a chirped pattern defined by a function $\Lambda(z)$ so that an overall spectrum of the fiber Bragg grating 40' is produced by the spectrum of each section of the fiber Bragg grating 40'. The period $\Lambda(z)$ of the chirped fiber grating 40' linearly changes along the longitudinal length (L) of the grating 40'. The chirped grating 40' can be manufactured using a chirped phase mask that modifies the grating depth.

When light is incident on the chirped fiber grating 40', different spectral components of the light are reflected by different parts of the grating 40'. Depending on the orientation of the grating 40' relative to incident light, long-wavelength light having slow propagation speed light may be reflected after short-wavelength light having fast propagation speed, or vice versa. The reflection wavelength of the chirped fiber grating 40' (i.e., the Bragg wavelength of each grating element) is spatially varying and has a linear dependence upon the grating length (L). Accordingly, different wavelengths are reflected at different grid periods. As shown in FIG. 10B, an envelope 48 of reflected power for the chirped fiber Bragg grating 40' is centered at the Bragg wavelength and has a wider bandwidth (BW) than the envelope for the uniform fiber Bragg grating (40: FIG. 9A-9B).

FIG. 10C graphs the envelope 48 of wavelength versus reflectivity for the standard chirped fiber Bragg gating 40 in more detail. As generally illustrated, wavelength feedback is shown for regions of the grating elements 48. Short wavelength feedback produces a short wavelength reflectivity region (R1), center wavelength feedback produces a center wavelength reflectivity region (R2), and long wavelength feedback produces a long wavelength reflectivity region (R3). For the standard chirped fiber Bragg grating 40, the reflectivity regions center about a center wavelength with the center wavelength reflectivity region (R2) being greater than the short and long wavelength reflectivity regions (R1 & R3).

Figures 1B, 1C:
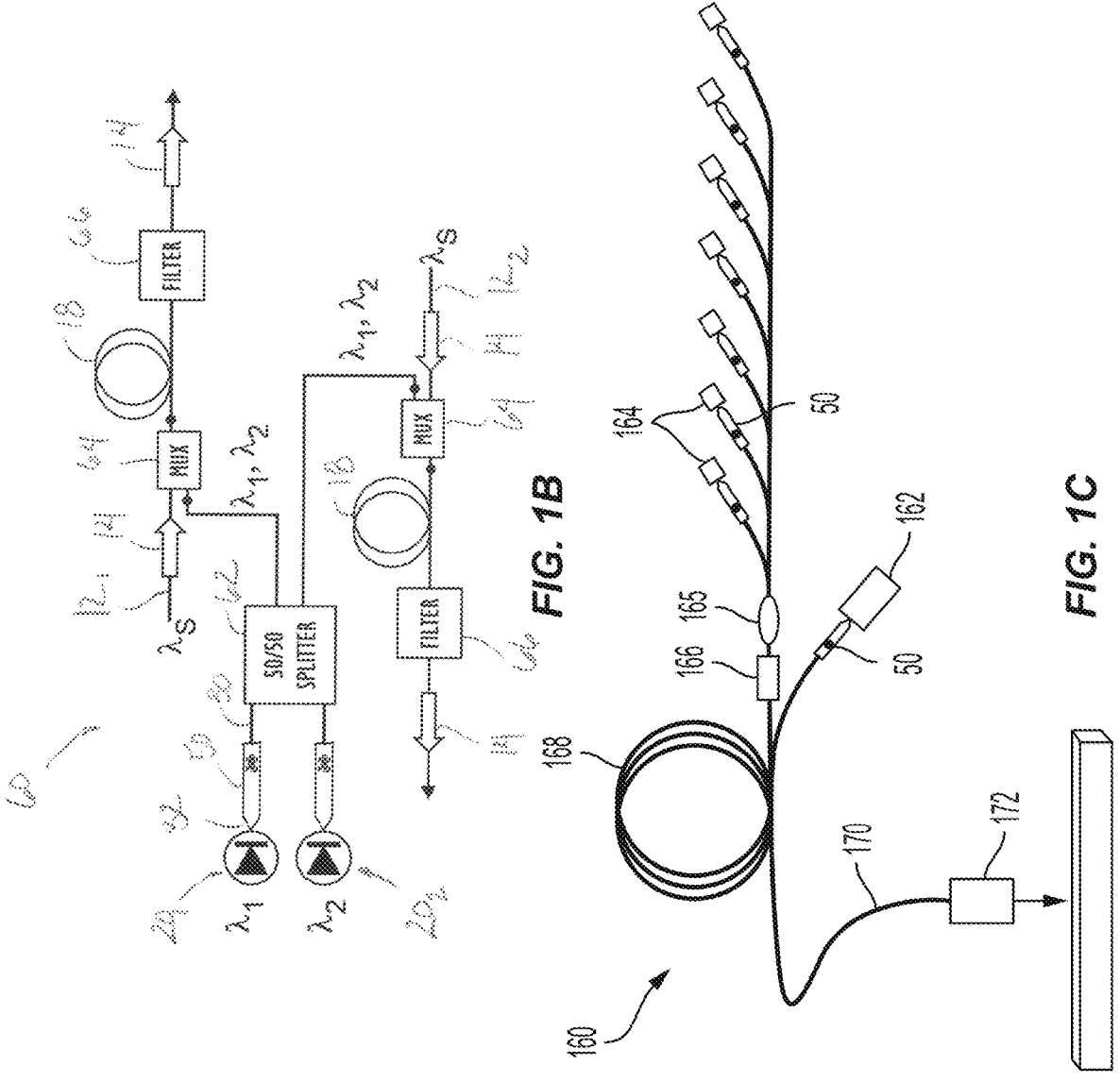
FIG. 1B illustrates a submarine repeater having optical fiber amplifiers according to the present disclosure.
FIG. 1C illustrates a Master Oscillator Power Amplifier (MOPA) system having an optical fiber amplifier according to the present disclosure.

As noted above with reference to FIG. 1A, the asymmetric chirped fiber Bragg grating 50 of the present disclosure can be useful in an optical amplifier 10 having a pump laser 20 outputting pump light P for a doped fiber 18. Other implementations can benefit from the asymmetric chirped fiber Bragg grating 50. For example, FIG. 1B illustrates a submarine repeater 60 having optical fiber amplifiers according to the present disclosure. The same numerals are used for comparable components in FIG. 1A.

The repeater 60 includes two pumps $20_{1-2}$, a splitter 62, and doped fiber amplifiers 18 for transmit and receive signal lines $12_{1-2}$. Each line $12_{1-2}$ includes a multiplexer 64, a doped fiber amplifier 18, and a filter 66. The two pumps $20_{1-2}$ at two wavelengths $\lambda_{1-2}$ feed pump light into the splitter 62, which splits the pump light for the signal lines $12_{1-2}$.

The submarine repeater 60 relies on pump splitting for redundancy. In the repeater 60, significant back reflection can come from the splices downstream from the multiplexers 64 and the fiber amplifiers 18. If the pumps $20_{1-2}$ develop a level of coherence, then the repeater 60 produces strong interference at the output of the 50/50 splitter 62. The back reflection can go all the way back to a given pump $20_{1-2}$ and can then be reflected back to the splitter 62, thus interfering with itself or the other pump $20_{1-2}$. The asymmetric chirped fiber Bragg gratings 50 are used on the fibers 30 for the pumps $20_{1-2}$ to counteract this.

In another example, FIG. 1C illustrates a fiber laser used in a Master Oscillator Power Amplifier (MOPA) system 160. The system 160 includes a pump 162 for a single mode that provides a seed input. The seed input is combined with input from multi-mode pumps 164 that connect via a coupling 165 and filter 166. The laser light passes to an active fiber 168, and the amplified laser light is then output by a fiber laser output optic 172 connected by a delivery fiber 170.

For example, a module having the seed pump 162 pulsed at 1064 nm can be used as the seed laser for an industrial ytterbium doped fiber laser used in marking, micromachining, soldering, etc. For a majority of applications, the seed laser pulses can be a couple of hundreds nanoseconds long with an amplitude of ~1 W. At high optical power levels achievable in the fiber laser, Stimulated Brillouin Scattering (SBS) can be triggered during the amplification, which can deteriorate the performance and reliability of the system 160. Having a spectrally broad seed laser during the pulse can be helpful because the SBS gain can be reduced by decreasing the spectral density of the seed laser. For this reason, increasing the spectral width of the seed laser using the approach disclosed herein can be beneficial in reducing the SBS and can increase the fiber laser operating power. Accordingly, asymmetric chirped fiber Bragg gratings 50 can be used on the pumps 162, 164.

In contrast to the uniform fiber Bragg grating 40 and the standard chirped fiber Bragg grating 40', discussion turns to the asymmetric chirped fiber Bragg grating 50 of the present disclosure.

FIG. 2A illustrates an asymmetric chirped fiber Bragg gating 50 according to the present disclosure. FIG. 2B graphs an envelope 58 of wavelength versus reflected power for the asymmetric chirped fiber Bragg gating 50, and FIG. 2C graphs the envelope 58 of wavelength versus reflectivity in more detail.

As schematically shown in FIG. 2A, a number (M) of grating elements 56 are formed at a period ($\Lambda(z^*)$) along a length (L) of a core 54 of a fiber having a cladding 52. The grating elements 56 are variations in the refractive index of the fiber core 54.

The grating elements 56 are arranged in a chirped pattern defined by a function Λ(z*) so that an overall spectrum of the fiber Bragg grating 50 is produced by the spectrum of each section of the fiber Bragg grating 50. The period Λ(z*) of the chirped Fiber grating 50 changes along the longitudinal length (L) of the grating 50, but further details of the grating 50 are different from the standard chirped fiber Bragg grating (40'; FIG. 10A).

In general, the fiber Bragg grating 50 can be fabricated using conventional techniques, such as using masking, step-by-step fiber translation, etc. For example, the core 54 of the fiber element can be illuminated with ultraviolet (UV) laser light, which produces modifications in the refractive index of the core 54. For example, a high-power ultra-violet (UV) laser can be used to create refractive index changes within the fiber core 54. The irradiated regions produce the grating elements 56 that provide reflective interfaces to feedback light to a laser diode. By controlling the level of irradiance used to produce each of these elements 56, the reflectivity caused by the change in the refractive index for each element 56 can be controlled. As will be appreciated by one skilled in the art having the benefit of the present disclosure, parameters for the fabrication of the grating 50 depend on a number of factors in a given implementation, such as the laser power, the UV frequency, and the pulse light used for irradiation; the fiber material used; the length of the disclosed fiber Bragg grating 50; etc.

Variable spacing is used between the grating elements 56, and variable reflectivities in the refractive indices are used for the grating elements 56. At the start of the fiber Bragg grating 50, a short distance between these elements 56 leads to reflections at the short wavelength end of the spectrum, corresponding to a short wavelength region. Whereas, at the end of the fiber Bragg grating 50, the longer spacing between grating elements 56 means the long wavelength end of the spectrum is reflected corresponding to a longer wavelength region. A central wavelength region lies between the short and long wavelength regions. The variation in spacing between the grating elements 56 effectively broadens the bandwidth of the fiber Bragg grating's response, and the variation in the reflectivities for the grating elements 56 shifts the peak wavelength away from the central wavelength of the grating structure.

For an implementation of a fiber Bragg grating that is targeted at reflecting the same wavelength and the same bandwidth of reflected light, the spacings for the standard chirped fiber Bragg grating (FIG. 10A) and the asymmetric chirped fiber Bragg grating (FIG. 2A) can be generally the same. For the standard chirped fiber Bragg grating (40': FIG. 10A), however, the reflectivity is highest at the central region (center wavelength) of the fiber Bragg grating's structure. By contrast, the reflectivity for the asymmetric chirped fiber Bragg grating 50 in FIGS. 2A-2C is configured to be highest at the short wavelength region of the fiber Bragg grating's structure.

As generally illustrated in FIG. 2C, wavelength feedback is shown for regions of the grating elements 56. Short wavelength feedback produces a short wavelength reflectivity region (R1), center wavelength feedback produces a center wavelength reflectivity region (R2), and long wavelength feedback produces a long wavelength reflectivity region (R3). For one implementation of the asymmetric chirped fiber Bragg grating 50, the reflectivity regions can be blue-shifted with the short wavelength reflectivity region (R1) being greater than the center and long wavelength reflectivity regions (R2 & R3), and specifically R1>R2>R3.

Thus, the optical fiber segment 30 shown in FIGS. 2A and 2C having the asymmetric chirped fiber Bragg grating 50 is configured to optically interact with or communicate with a laser diode's pump light (P). The fiber Bragg grating 50 has a length (L) and has a plurality of variations 56 in refractive index produced in the core 54. The variations 56 have a chirped period changing spatially (e.g., linearly) along the length of the fiber Bragg grating 50. The chirped period has a first reflectivity for one of a short or a long wavelength region (R1, R3) of the fiber Bragg grating 50. The first reflectivity is shifted asymmetrically from a central wavelength region (R2) of the fiber Bragg grating 50. As illustrated in FIG. 2C, the first reflectivity of the short wavelength region (R1) is greater than a second reflectivity of the central wavelength region (R2) and is greater than a third reflectivity of the other of the long wavelength region (R3). Although the asymmetric chirped fiber Bragg grating 50 could alternatively be redshifted to the long wavelength reflectivity region (R3) being greater than the short and center wavelength reflectivity regions (R1 & R2), such an implementation would not be necessarily usable in most applications because the implementation would produce narrower net gain, which would be less beneficial as discussed below.

The blue-shifted asymmetric structure can compensate for long wavelength modes that dominate the light from a laser diode (20) in a given implementation. In this way, the center wavelength is blue-shifted away from a lone peak wavelength that can tend to dominate in the given implementation. Clearly, for a standard chirped fiber Bragg grating (40': FIG. 10C), the center wavelength would be the same as the peak wavelength. Here, however, the blue-shift is made significant enough to provide the desired compensation and to ensure there are no dominant long wavelength peaks. (Further details of this are discussed with reference to FIGS. 4A to 5B specifically.)

In one implementation, the reflectivity width for the grating 50 containing more than 10 modes at Full-Width Half Maximum (FWHM) (if the distance between modes is about 30 pm) would give FWHM about 0.3 nm. The asymmetry that blue shifts the center wavelength from the peak wavelength can be defined as: $\Delta\lambda = \lambda_{center} - \lambda_{peak} > 0.2\times$ FWHM. Other implementations can be configured differently.

Looking back at the system of FIG. 1A, the asymmetric chirped fiber Bragg grating 50 as disclosed herein can be used with a 980-nm pump laser diode 20 where good power stability performance is required, particularly when combining outputs from multiple pump laser diodes 20 for the optical fiber amplifier 10, such as illustrated in FIG. 1A.

In particular, outputs from the multiple pump laser diodes 20 as in FIG. 1A can produce "coherent" laser output, which can cause interference and reduce output power. The desire is to make the laser outputs more "incoherent" to reduce interference and reduce power instabilities in the amplifier output. Using a standard chirped fiber Bragg grating (40' as in FIG. 10A) on a laser diode 20 does not guarantee that an "incoherent" laser output will be produced because the standard chirped fiber Bragg grating (40': FIG. 10A) can still generate a dominant mode within the FBG's envelope. In particular, the combination of laser gain peak, front facet reflectivity, and an imperfect Gaussian FBG profile can lead at Iop>>Ith to a dominant laser mode biased to one side of the FBG envelope. This is due to spectral hole burning.

In contrast, the asymmetric chirped fiber Bragg grating 50 as disclosed herein skews the FBG reflectivity envelope to the short wavelength side. This promotes gain values for the less dominant modes, therefore decreasing the coherence of the laser diode 20 and improving the output power stability.

In addition to the benefits for pump laser diodes as in FIG. 1A, the asymmetric chirped fiber Bragg grating 50 can also be used in 10xx nm seed lasers, where the asymmetric chirped fiber Bragg grating 50 can provide a broader optical spectrum in a pulsed mode, which can counteract nonlinear effects in fiber lasers. Additionally, the broad emission spectrum of the asymmetric chirped fiber Bragg grating 50 as disclosed herein is also useful in a fiber laser for a submarine repeater (FIG. 1B), for a master oscillator power amplifier (MOPA) system (FIG. 1C), or for other configurations. Namely, the broad spectrum increases the threshold for the nonlinear effect in the fiber and hence allows higher optical power to be produced.

As noted above, the asymmetric chirped fiber Bragg grating 50 of the present disclosure can be used to reduce coherence of pump lasers, such as the 980 nm pump laser diodes as in FIG. 1A. To lay this out in more detail, discussion turns to FIGS. 3A through 5B.

Power variation in a FBG-locked, 980 nm pump laser diode (20) that is locked by a fiber Bragg grating can be an issue for particular applications. Power variation is generally caused by the coherence of the laser diode (20) and is a result of mode hopping within the envelop of the fiber Bragg grating, which leads to changes in ex-fiber power. For an FBG-locked Fabry Perot laser diode, coherence is determined by how many spectral modes of power are shared across the envelope of the fiber Bragg grating. The less modes there are: the more coherent the laser light becomes, and the higher the power variation will be.

Figure 3A:
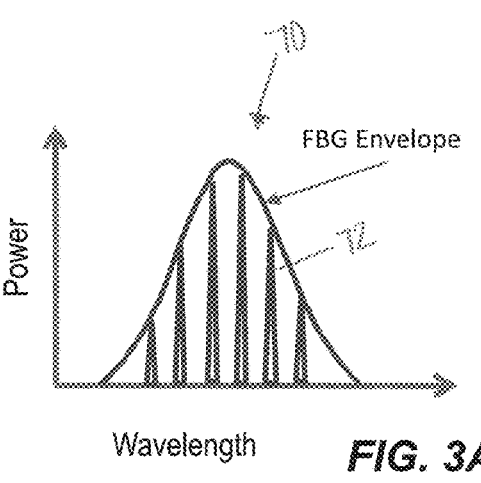
FIG. 3A graphs a standard envelope of power relative to wavelength for a uniform fiber Bragg grating.
Figure 3B:
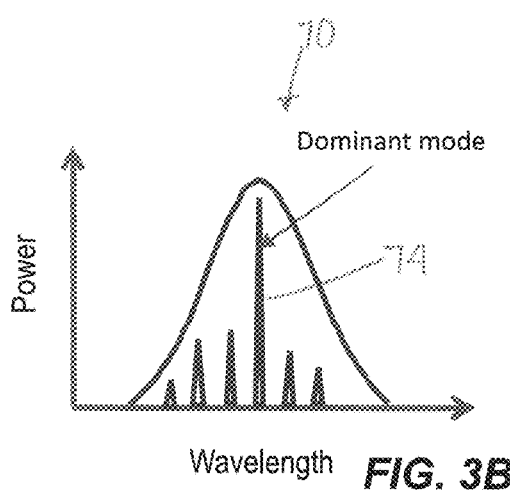
FIG. 3B graphs a dominant mode in the standard envelope.

FIG. 3A shows a standard envelope 70 of power relative to wavelength for a uniform fiber Bragg grating. A number of spectral modes 72 of power are shown. As noted, the less modes 72 there are: the more coherent the laser light becomes, and the higher the power variation will be. As shown in FIGS. 3B, higher coherence also arises when one spectral mode 74 dominates in the standard envelope 70 and when adjacent modes are suppressed in the standard envelope 70.

Figure 4A:
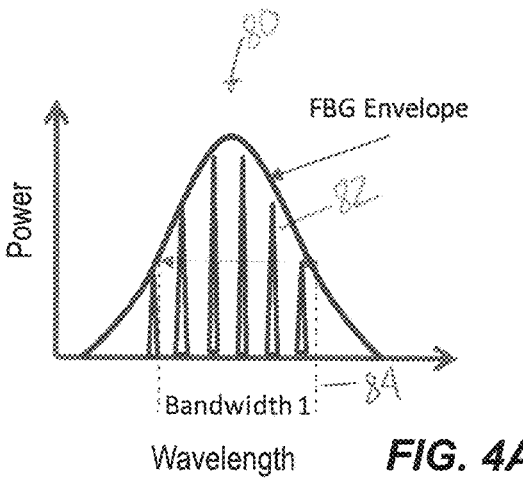
FIGS. 4A-4B graph envelopes for a standard chirped fiber Bragg grating that provides wider bandwidth.
Figure 4B:
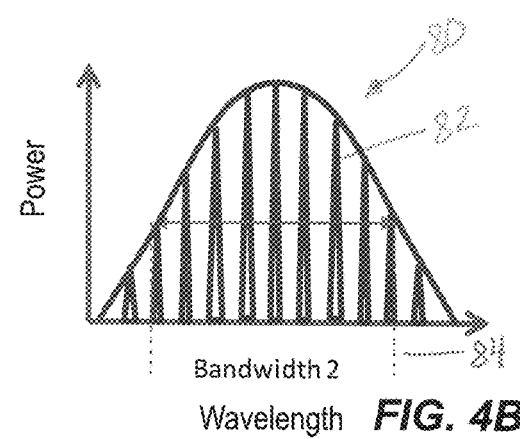

One solution to reduce the coherence of the laser light is to use a standard chirped fiber Bragg grating (40') that provides wider bandwidth. FIGS. 4A-4B show envelopes 80 for standard chirped fiber Bragg gratings (40') that provide wider bandwidth (84; FIG. 4B). As shown, more modes 82 can be captured within the envelopes 80, thus increasing the power sharing across an increased number of modes 82.

Figure 5A:
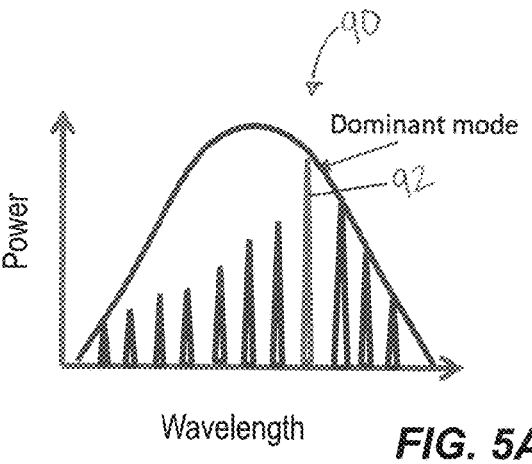
FIG. 5A graphs a dominant mode in the envelope for the standard chirped fiber Bragg grating.

As shown in FIG. 5A, however, even a standard chirped fiber Bragg grating (40') does not guarantee that incoherent laser light will be produced because the standard chirped fiber Bragg grating (40') can still generate a dominant mode 92 within the envelope 90. At high operating currents (Iop>>Ith), the combination of laser gain peak, front facet reflectivity, and an imperfect Gaussian FBG profile can lead to the dominant laser mode 92 biased to one side of the envelope 90. This is due to spectral hole burning, which is discussed in more detail later.

Figure 5B:
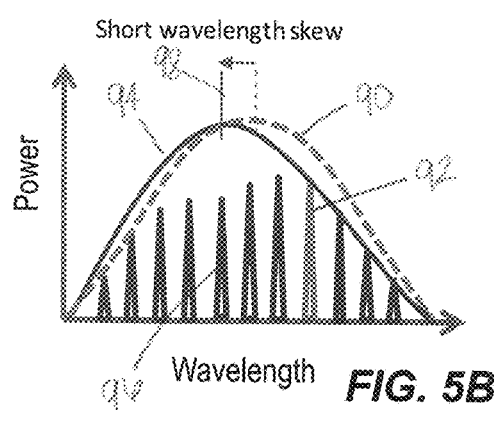
FIG. 5B graphs a skewed reflectivity envelope for the disclosed asymmetric chirped fiber Bragg grating of the present disclosure.

As shown in FIG. 5B, however, an asymmetric chirped fiber Bragg grating (50) of the present disclosure has a reflectivity envelope 94 shifted or skewed to the short wavelength side compared to the standard envelope 90. The shifted reflectivity envelope 94 limits gain of a dominant laser mode 92 and promotes gain of the less dominant modes 96, therefore decreasing the coherence of the laser light and improving the output power stability. Again, although the asymmetric chirped fiber Bragg grating (50) could alternatively be shifted or skewed to the long wavelength reflectivity side, such an implementation would not be usable in most applications because the implementation would produce narrower net gain, which would be less beneficial as discussed below.

As mentioned briefly above, the asymmetric chirped fiber Bragg grating (50) of the present disclosure suppresses spectral hole burning. The reflectivity profile of the asymmetric chirped fiber Bragg grating (50) is biased to higher energy (shorter wavelength) side. This broadens the net gain for modes on the long wavelength side of the envelope as compared to the net gain that these modes would see from a standard chirped FBG profile (40').

In the event of spectral hole burning, the asymmetric chirped fiber Bragg grating (50) will end up with a much broader net gain peak, resulting in a broader emission spectrum for both a pulsed signal and a continuous wave CW signal. Broader spectrum for the continuous wave (CW) signal will also reduce the noise originating from the mode switching during any instabilities in the laser cavity of the laser diode (20).

Figures 6A, 6B, 6C, 7A, 7B:
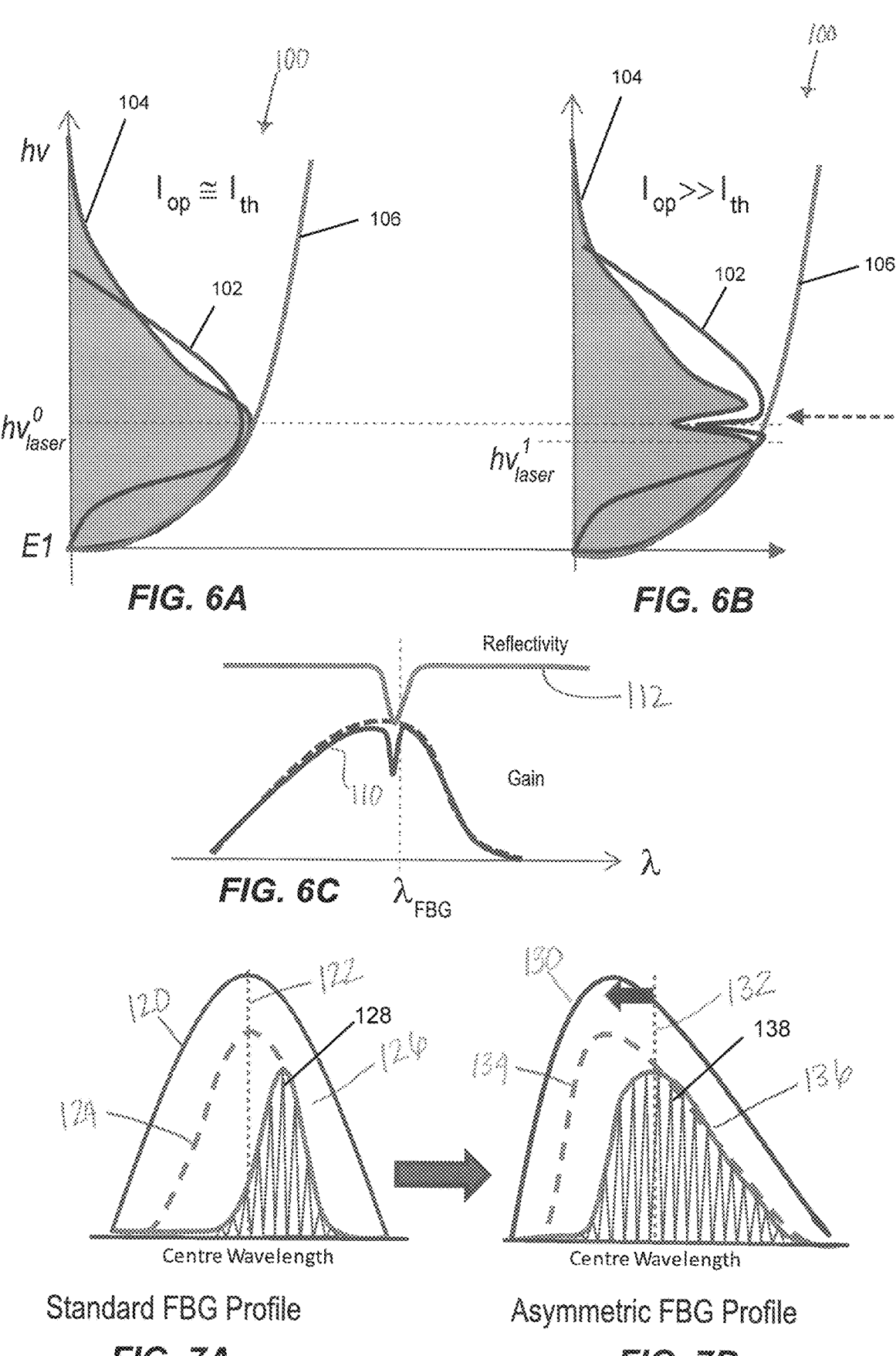
FIG. 6A graphs gain and carrier distribution for a laser operating at lower current/optical power.
FIG. 6B graphs gain and carrier distribution for a laser operation at high current/optical power that produces spectral hole burning.
FIG. 6C graphs gain and reflectivity for wavelengths when feedback is provided by an external fiber Bragg grating with finite reflectivity and width in the presence of spectral hole burning.
FIG. 7A graphs reflectivity in a standard profile along with a net gain without spectral hole burning and another net gain with spectral hole burning.
FIG. 7B graphs reflectivity in another profile according to the present disclosure along with a net gain without spectral hole burning and another net gain with spectral hole burning.

Spectral hole burning (SHB) is a known, nonlinear effect. To illustrate spectral hole burning, FIG. 6A is a graph 100 of gain 102 and carrier distribution 104 for laser operation at lower current/optical power. These are shown relative to the parabolic band 106. Meanwhile, FIG. 6B is a graph 100 of gain 102 and carrier distribution 104 for the laser operation at high current/optical power that produces spectral hole burning.

Spectral hole burning occurs when a carrier thermalization rate is similar to or smaller than a radiative recombination rate. This occurs typically at high current/optical power level Iop>>Ith, when carrier capture/thermalization rate is slower compared to the photon generation rate at photon energy $hv_{laser}{}^{0}$, resulting in decreased gain at the photon energy $hv_{laser}{}^{0}$ and corresponding shift of the photon energy towards the new net gain maximum at $hv_{laser}{}^{1}$.

For a situation in which the feedback is provided by an external fiber Bragg grating with finite reflectivity and width, the spectral hole burning will narrow the emission spectrum and corresponding red shift of $\lambda_{FBG}$ further away from the reflectivity maximum, but still within the reflectivity spectrum. For example, FIG. 6C graphs gain 110 and reflectivity 112 for wavelengths when feedback is provided by an external fiber Bragg grating with finite reflectivity and width.

Here, the asymmetric chirped fiber Bragg grating (50) supresses spectral hole burning by biasing the reflectivity profile to the higher energy (shorter wavelength) side. This broaden the net gain for modes on the long wavelength side of the FBG envelope as compared to the net gain these modes would see from a symmetrical chirped FBG profile (40').

For comparison, FIG. 7A graphs reflectivity 120 in a standard FBG profile. The reflectivity 120 has a peak at the center wavelength 122 and is symmetrical about the central region. A net gain 124 without spectral hole burning is also shown relative to another net gain 126 with spectral hole burning. Narrow net gain 126 can result in the dominant mode 128. Meanwhile, FIG. 7B graphs reflectivity 130 in an standard FBG profile according to the present disclosure. The reflectivity 130 has a peak blue-shifted from the center wavelength 132 and is asymmetrical about the central region. A net gain 134 without spectral hole burning is also shown relative to another net gain 136 with spectral hole burning.

In the event of spectral hole burning, therefore, the asymmetric chirped fiber Bragg grating (50) as shown in FIG. 7B can still produce a much broader net gain peak 136, resulting in broader emission spectrum, capturing more FP modes 138, both in pulsed mode and in CW mode. Broader spectrum in the CW mode will also reduce the noise originating from the mode switching during possible insta- bilities in the laser cavity of the laser diode.

Figures 8A, 8B:
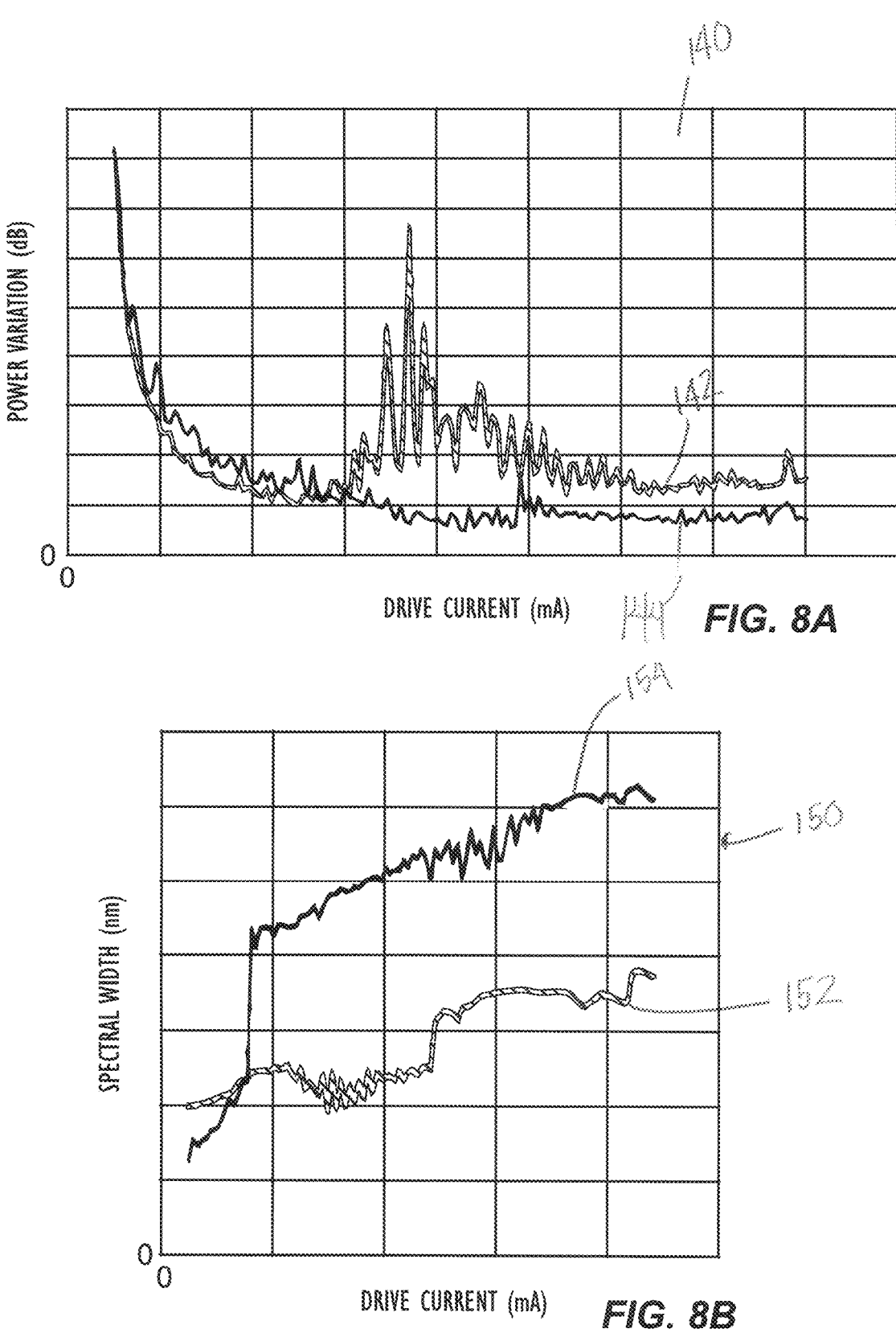
FIG. 8A graphs power variation for a laser driven by a drive current when locked using a standard chirped fiber Bragg grating and an asymmetric chirped fiber Bragg grating of the present disclosure.
FIG. 8B graphs spectral width for a laser driven by a drive current when locked using a standard chirped fiber Bragg grating and an asymmetric chirped fiber Bragg grating of the present disclosure.

The asymmetric chirped fiber Bragg grating (50) of the present disclosure has some positive benefits on power variation and spectral width on a laser diode (20) locked by the asymmetric chirped fiber Bragg grating (50). The graph 140 in FIG. 8A shows a power variation 142 for a laser driven by a drive current when locked using a standard chirped fiber Bragg grating (40') versus another power variation 144 for a laser driven by a drive current when locked using an asymmetric chirped fiber Bragg grating (50) of the present disclosure. As can be seen, the asymmetric chirped fiber Bragg grating (50) provides more stable power variation 144 with drive current for a laser compared to the variation 142 of the standard chirped fiber Bragg grating (40') when used on the same laser. The bandwidth is nominally the same for both fiber Bragg gratings (40', 50) in this example.

The graph 150 in FIG. 8B shows a standard spectral width 152 for a laser driven by a drive current when locked using a standard chirped fiber Bragg grating (40') versus another spectral width 154 for a laser driven by a drive current when locked using an asymmetric chirped fiber Bragg grating (50) of the present disclosure. The improved power variation provided by the asymmetric chirped fiber Bragg grating (50) produces an increase in spectral width 154 not seen with the width 152 for the standard chirped fiber Bragg grating (40').

The foregoing description of preferred and other embodi- ments is not intended to limit or restrict the scope or applicability of the inventive concepts conceived of by the Applicants. It will be appreciated with the benefit of the present disclosure that features described above in accor- dance with any embodiment or aspect of the disclosed subject matter can be utilized, either alone or in combina- tion, with any other described feature, in any other embodi- ment or aspect of the disclosed subject matter.

In exchange for disclosing the inventive concepts con- tained herein, the Applicants desire all patent rights afforded by the appended claims. Therefore, it is intended that the appended claims include all modifications and alterations to the full extent that they come within the scope of the following claims or the equivalents thereof.

What is claimed is:

1. An optical device used with a laser diode, the laser diode having front and back end facets and being configured to output light at a selected wavelength, the optical device comprising:

an optical fiber segment configured to optically interact with the output light from the front end facet of the laser diode, the optical fiber segment having a fiber Bragg grating, the fiber Bragg grating having a plurality of refractive index variations, the refractive index variations having a chirped period changing spatially along a length of the fiber Bragg grating, the refractive index variations in the chirped period hav- ing a first reflectivity for a short wavelength region of the fiber Bragg grating, the first reflectivity being shifted asymmetrically from a central wavelength region of the fiber Bragg grating, being greater than a second reflectivity for the central wavelength region, and being greater than a third reflectivity for a long wavelength region wherein the fiber Bragg grating has a center wavelength in the central wavelength region, the center wavelength being at a center of the fiber Bragg grating, and the fiber Bragg grating has a peak wavelength in the short wavelength region offset from the central wavelength, wherein the offset is greater than 0.2 times a full-width half maximum (FWHM) of a combined reflectivity bandwidth of the fiber Bragg grating for the first reflectivity, the second reflectivity, and the third reflec- tivity.

2. The optical device of claim 1, wherein the first reflec- tivity for the short wavelength region is greater than the second reflectivity for the central wavelength region, and wherein the second reflectivity is greater than the third reflectivity for the long wavelength region.

3. The optical device of claim 1, wherein a fiber tip of the optical fiber segment comprises a lens structure being con- figured to optically couple with the output light from the front end facet.

4. The optical device of claim 1, wherein the chirped period of the refractive index variations period changes linearly along the length of the fiber Bragg grating.

5. A fiber amplifier to amplify seed light having a seed wavelength, the fiber amplifier comprising:

the optical device of claim 1;

the laser diode, wherein the laser diode is configured to generate pump light at a pump wavelength, the front end facet having a front reflectivity, the back end facet having a back reflectivity; and a doped fiber being doped with an active dopant, the doped fiber being in optical communication with the seed light and being in optical communication with at least a portion of the pump light from the laser diode, the pump wavelength of the pump light configured to interact with the active dopant of the fiber and thereby amplify the seed light.

6. The fiber amplifier of claim 5, wherein the first reflec- tivity for the short wavelength region is greater than the second reflectivity of the central wavelength region, and wherein the second reflectivity is greater than the third reflectivity for the long wavelength region.

7. The fiber amplifier of claim 5, wherein a fiber tip of the optical fiber segment comprises a lens structure being con- figured to optically couple with the output light.

8. The fiber amplifier of claim 5, wherein the chirped period of the refractive index variations changes linearly along the length of the fiber Bragg grating.

9. The fiber amplifier of claim 5, comprising a combiner disposed on an optical path of the seed light and being configured to combine the pump light with the seed light on the optical path.

10. The fiber amplifier of claim 9, further comprising an isolator disposed on the optical path upstream of the com- biner.

11. The fiber amplifier of claim 5, wherein the front facet has the front reflectivity at least at the pump wavelength; wherein the back facet has the back reflectivity at least at the pump wavelength; and wherein the front reflectivity is lower than the back reflectivity.

12. The fiber amplifier of claim 11, wherein the fiber Bragg grating defines an external resonant cavity with the back end facet, the external resonant cavity configured to lock the pump light to the pump wavelength.

13. A method to amplify seed light having a seed wavelength, the method comprising:

generating pump light with a laser diode, the pump light having a pump wavelength different from the seed wavelength, the laser diode having a front facet with a front reflectivity;

coupling the pump light from the front facet of the laser diode with an optical fiber segment having a fiber Bragg grating, the fiber Bragg grating having a length and having a plurality of refractive index variations, the refractive index variations having a chirped period changing spatially along the length of the fiber Bragg grating;

locking the pump light of the laser diode to the pump wavelength by reflecting at least a portion of the pump light back to the front facet using the fiber Bragg grating, the refractive index variations in the chirped period having a first reflectivity for a short wavelength region of the fiber Bragg grating, the first reflectivity being shifted asymmetrically from a central wavelength region of the fiber Bragg grating, being greater than a second reflectivity of the central wavelength region, and being greater than a third reflectivity of a long wavelength region, wherein the fiber Bragg grating has a center wavelength in the central wavelength region, the center wavelength being at a center of the fiber Bragg grating, and the fiber Bragg grating has a peak wavelength in the short wavelength region offset from the central wavelength, wherein the offset is greater than 0.2 times a full-width half maximum (FWHM) of a combined reflectivity bandwidth of the fiber Bragg grating for the first reflectivity, the second reflectivity, and the third reflectivity;

transmitting the seed light and at least a portion of the pump light to a doped fiber; and amplifying the seed light by interacting the pump light with the doped fiber.

14. The method of claim 13, comprising fabricating the refractive index variations in the chirped period to have the first reflectivity for the short wavelength region being greater than the second reflectivity for the central wavelength region, and the second reflectivity being greater than the third reflectivity for the long wavelength region.

15. The method of claim 13, wherein coupling the pump light from the front facet of the laser diode with the optical fiber segment comprising coupling a lens structure at a fiber tip of the optical fiber segment with the front facet.

16. The method of claim 13, comprising fabricating the refractive index variations such that the chirped period changes linearly along the length of the fiber Bragg grating.

17. The method of claim 13, wherein transmitting the seed light and at least the portion of the pump light to the doped fiber amplifier combining the portion of the pump light with the seed light using a combiner disposed on an optical path of the seed light.

18. The method of claim 17, further comprising isolating back reflection of light using an isolator disposed on the optical path upstream of the combiner.

19. The method of claim 13, wherein generating the pump light with the laser diode comprises generating the pump light in a waveguide of the laser diode having the front facet and a back facet, the front facet having the front reflectivity at least at the pump wavelength, the back facet having a back reflectivity at least at the pump wavelength, the front reflectivity being different from the back reflectivity.

20. The method of claim 19, wherein locking the pump light of the laser diode to the pump wavelength comprises defining an external resonant cavity between the back facet and the fiber Bragg grating.

* * * * *